United States Patent
Delshadpour et al.

(10) Patent No.: US 11,206,161 B1
(45) Date of Patent: Dec. 21, 2021

(54) ADAPTIVE EQUILIZER AND GAIN CONTROLLER

(71) Applicant: NXP B.V., Eindhoven (NL)

(72) Inventors: Siamak Delshadpour, Phoenix, AZ (US); Cornelis Johannes Speelman, Wijchen (NL); Stefan Kwaaitaal, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/022,989

(22) Filed: Sep. 16, 2020

(51) Int. Cl.
*H04L 25/03* (2006.01)
*H04L 27/01* (2006.01)

(52) U.S. Cl.
CPC .. *H04L 25/03885* (2013.01); *H04L 25/03343* (2013.01); *H04L 27/01* (2013.01)

(58) Field of Classification Search
CPC ......... H04L 25/03885; H04L 25/03343; H04L 27/01
See application file for complete search history.

(56) References Cited

U.S. PATENT DOCUMENTS

| | | | |
|---|---|---|---|
| 6,819,166 B1 | 11/2004 | Choi et al. | |
| 7,697,600 B2 | 4/2010 | Maangat et al. | |
| 9,917,707 B2* | 3/2018 | Pan | H04L 25/03057 |
| 10,367,666 B2* | 7/2019 | Zhang | H03M 1/182 |
| 10,447,507 B1 | 10/2019 | Zhang et al. | |
| 2008/0123729 A1* | 5/2008 | Kobayashi | H04L 25/03885 375/232 |
| 2010/0194478 A1* | 8/2010 | Maillard | H03F 3/45183 330/254 |
| 2011/0317751 A1 | 12/2011 | Roethig et al. | |
| 2013/0034143 A1 | 2/2013 | Acosta-Serafini et al. | |
| 2014/0169439 A1* | 6/2014 | Liu | H04L 25/03038 375/233 |
| 2019/0052488 A1* | 2/2019 | Fujii | H04L 25/03076 |
| 2020/0021468 A1* | 1/2020 | Sakai | H04L 25/03057 |
| 2020/0153395 A1* | 5/2020 | Geng | H03K 5/003 |

OTHER PUBLICATIONS

Lee, J. "A 20-Gb/s Adaptive Equalizer in 0.13 um CMOS Technology", IEEE Journal of Solid-State Circuits, vol. 41, No. 9, pp. 2058-2066 (Sep. 2006).
Liu, H. et al. "A 5-Gb/s Serial-Link Redriver With Adaptive Equalizer and Transmitter Swing Enhancement", IEEE Transactions on Circuits and Systems-I: Regular Papers, vol. 61, No. 4, pp. 1001-1011 (Apr. 2014).

(Continued)

*Primary Examiner* — Freshteh N Aghdam

(57) ABSTRACT

An adaptive equalizer and automatic gain controller is disclosed. The adaptive equalizer and automatic gain controller includes a programmable continuous time linear equalizer (CTLE). The CTLE includes a control port to receive a control signal to adjust a frequency response of the CTLE. The adaptive equalizer and automatic gain controller also includes a power comparator coupled with an output of the CTLE and a controller coupled with the power comparator and the control port and configured to generate the control signal for the CTLE based on the output of the power comparator. The power comparator is configured to compare power of a low frequency part and a high frequency part of an output signal of the CTLE.

20 Claims, 3 Drawing Sheets

(56) References Cited

OTHER PUBLICATIONS

Pan, Q. et al. "A 41-mW 30-Gb/s CMOS Optical Receiver with Digitally-Tunable Cascaded Equalization", 40th IEEE European Solid State Conference ESSCIRC 2014, pp. 127-130 (Sep. 2014).
Liu, H. et al. "An HDMI Cable Equalizer With Self-Generated Energy Ratio Adaptation Scheme", IEEE Transactions on Circuits and Systems-II: Express Briefs, vol. 56, No. 7, pp. 595-599 (Jul. 2009).

* cited by examiner

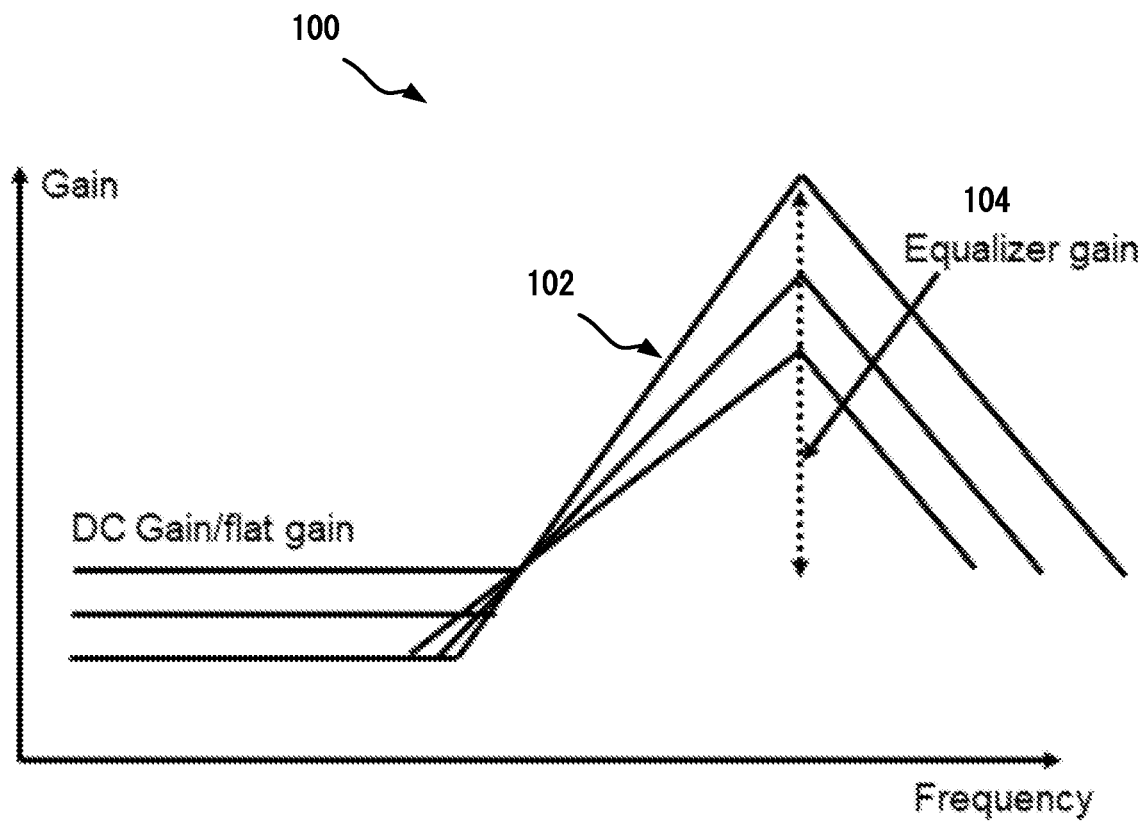
Fig. 1
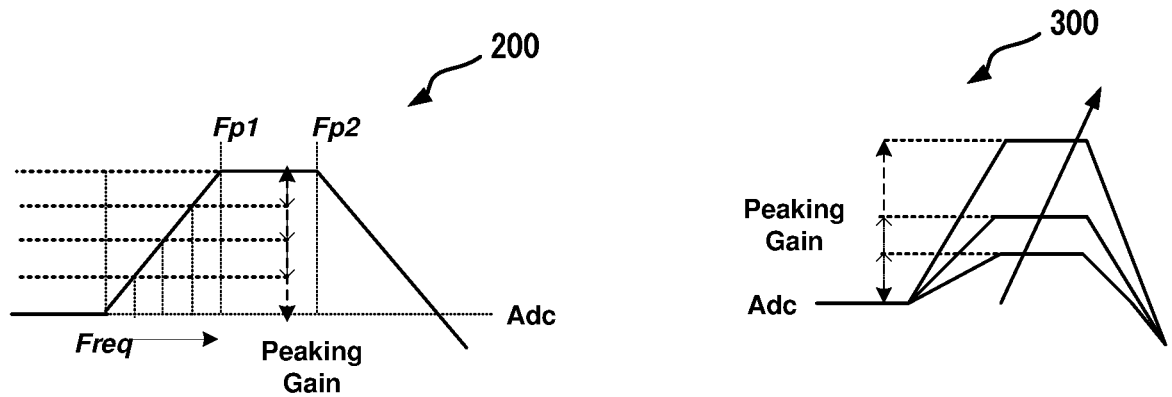
Fig. 2
Fig. 3

ADAPTIVE EQUALIZER AND GAIN CONTROLLER

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO) and any other high-speed wide band wired communication require stages of processing within their electronic circuitry.

Wide band data communications system circuitry can include several stages including modules to equalize, amplify and/or re-drive signals for every data channel. Usually one stage cannot provide enough gain or equalization. In such multi-stage systems, the use of intermediate buffers between each stage may be necessary. Oftentimes, however, the buffer consumes even more power than the equalizer, amplifier and drivers, which makes a design with less buffer blocks more favorable in the system, especially for use in low voltage (i.e., ~1.8V or lower) systems. What are needed is an efficient a continuous time linear equalization circuit (CTLE) with a gain stage with automatic gain control.

SUMMARY

In one embodiment, an digitally controlled adaptive equalizer is disclosed. The adaptive equalizer is also configured to automatically control the gain. The adaptive equalizer includes a programmable continuous time linear equalizer (CTLE). The CTLE includes a control port to receive a control signal to adjust a frequency response of the CTLE. The adaptive equalizer also includes a power comparator coupled with an output of the CTLE and a controller coupled with the power comparator and the control port and configured to generate the control signal for the CTLE based on the output of the power comparator. The power comparator is configured to compare power of a low frequency part and a high frequency part of an output signal of the CTLE.

In some examples, the power comparator includes a low pass filter coupled with a rectifier and an output of the rectifier is coupled with a comparator. The comparator is configured to compare a voltage at the output of the rectifier with a reference voltage. The power comparator further includes a high pass filter coupled with a second rectifier and an output of the second rectifier is coupled with the comparator. The comparator is configured to compare a voltage at the output of the rectifier with a voltage at the output of the second rectifier. The controller includes an up-down counter. The up-down counter increments or decrements based on the output of the power comparator. The controller is configured to generate the control signal based on counter value of the up-down counter. Part of the power comparator with the low pass filter will be used for automatic gain control.

In some embodiments, the receiver includes an equalizer and a programmable gain amplifier (PGA) coupled with the output of the CTLE. The output of the PGA is coupled with an input of the power comparator through a buffer. The adaptive equalizer may be part of a serial link receiver coupled with the output of the PGA. The output of the line driver is coupled with an input of the power comparator through a buffer. The controller is configured to generate a second control signal based on an output of the power comparator to control a gain of the PGA.

In some examples, the controller includes an enable port to receive an enable signal. The enable signal may be automatically generated based on a mode of operation. For example at beginning of the communication, the control signal may also be generated by digital state machine based on a desired protocol, for example USB protocol. In some examples, the controller output can be overwritten externally (e.g., through I2C port) to provide the control signals from an external source that may be controlled by a programmable state machine.

In some embodiments, the low pass filter and the high pass filter include configurable components to configure a frequency cut-off of the low pass filter and the high pass filter. Depends on the strategy, this feature can be used as level of equalization too.

In another embodiment, a method for automatic equalization and gain control is disclosed. The method includes comparing, in a first period, power of a low frequency part of a signal at an output of a programmable continuous time linear equalizer (CTLE) with power of a high frequency part of the signal to generate a first digital signal and comparing, in a second period, the power of the low frequency part with a reference voltage to generate a second digital signal. Based on the comparing, a first digital signal is generated in the first period and a second digital signal is generated in the second period using an up-down counter. The first digital signal is used to change a frequency response of the CTLE and the second digital signal is used to change a gain of a programmable gain amplifier.

In some examples, the comparing includes filtering the signal using a low pass filter and a high pass filter, rectifying outputs of the low pass filter and the high pass filter and comparing the rectified outputs to generate the first digital signal. In another example, the comparing includes filtering the signal using a low pass filter, rectifying output of the low pass filter and comparing the rectified output with the reference voltage to generate the second digital signal.

BRIEF DESCRIPTION OF THE DRAWINGS

FIGS. 1, 2 and 3 show examples of a frequency response of a continuous time linear equalization (CTLE) circuit.

Throughout the description, similar reference numbers may be used to identify similar elements.

DETAILED DESCRIPTION

Figure 4:
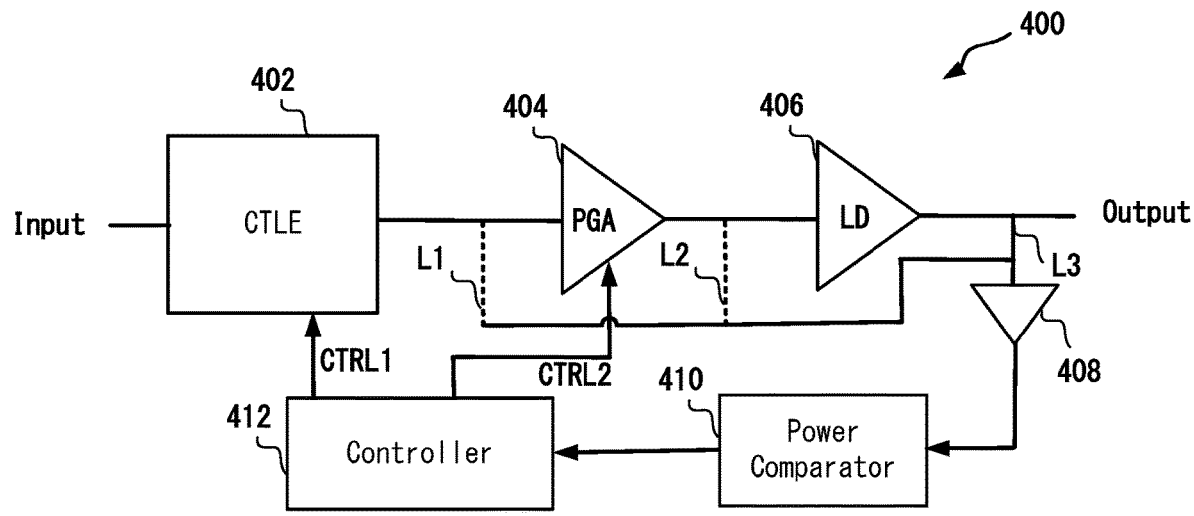
FIG. 4 depicts a schematic of an adaptive equalizer and gain controller in accordance with one or more embodiments.

It will be readily understood that the components of the embodiments as generally described herein and illustrated in the appended FIGS. could be arranged and designed in a wide variety of different configurations. Thus, the following more detailed description of various embodiments, as represented in the FIGS., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

U.S. Pat. No. 6,819,166 by Jong-Sang Choi et al. discloses method and system for continuous-time, low-frequency-gain/high-frequency-boosting joint adaptation equalizer, which is incorporated herein by reference. US 2011/0317751 by Wolfgang Roethig et al. discloses an adaptive equalizer for high-speed serial data, which is incorporated herein by reference. Publication entitled "A 20-Gb/s Adaptive Equalizer in 0.13 um CMOS Technology" by Jri Lee, 2006 IEEE International Solid State Circuits Conference-Digest of Technical Papers is incorporated herein by reference. Publication "A 5-Gb/s Serial-Link Redriver With Adaptive Equalizer and Transmitter Swing Enhancement" by Haiqi Liu et al, IEEE Transactions on Circuits and Systems I: Regular Papers (Volume: 61, Issue: 4, April 2014 Page(s): 1001-1011) is incorporated herein by reference.

Embodiments described herein use a programmable continuous time linear equalizer (CTLE) to implement an adaptive equalizer. The CTLE is well known in the art. Any conventional CTLE with a digital control input to control the frequency response can be used in the embodiments described herein. The adaptive equalization process can be applied whenever chip (that includes the adaptive equalizer) starts up or periodically (depends on the application requirements). The adaptive equalizer can be configured to be used in different frequency ranges according to standards such as USB. A continuous time linear equalizer (CTLE) with programmable peaking gain can be used by the invented scheme to shape the adaptive equalizer. Among others, the embodiments described herein may be used in a Universal Serial Bus (USB) system, a DisplayPort (DP) system, a PCIe (Peripheral Component Interconnect Express) system, a Thunderbolt system, or another communications system or any other wired high-speed communication standards. The control loop can be used for the path to shape an automatic gain control scheme as well.

As data rate increases, a high speed CTLE with programmable DC and equalizer gain becomes important in the communication system in order to support various communication channels, e.g., microstrip, coaxial cable with different lengths. However, traditional CTLE can only change its equalizer gain, defined as the gain difference between the maximum gain across the frequency and the DC gain (low frequency output gain), by varying its DC gain. This needs additional gain stage to adjust the DC gain to the target value. A CTLE with fix DC gain may not need a gain stage after that while a conventional CTLE with variable DC gain may need gain stage(s) after that. Adjusting gain of the path will be another job which the introduced scheme will handle that part too.

FIG. 1 shows a frequency response curve 100 of a CTLE scheme. Peaking gain of the CTLE is defined as the gain difference between the maximum gain and the DC gain of the CTLE. A conventional CTLE changes its equalizer gain by varying its DC gain (Adc) as is shown in FIG. 2, therefore requiring an additional programmable gain stage to control the total DC gain. FIG. 3 shows another CTLE curve which its gain achieves by changing the Nyquist frequency gain while its DC gain is fix. This may avoid need of programmable gain stage after the CTLE. Changing gain of CTLE in any of the two shown methods will change power spectrum of its low frequency or high frequency portions. Higher CTLE gain means higher power for the high frequency portion.

FIG. 4 depicts a schematic of an adaptive equalizer 400. The adaptive equalizer 400 includes a CTLE 402. The CTLE 402 is configured to be controlled programmatically to vary its gain. The adaptive equalizer 400 may use any CTLE circuit that includes programmable gain control. In some examples, a programmable gain amplifier (PGA) 404 is included. The PGA 404 is an amplifier whose gain can be controlled by a digital or analog control signal. In some examples, a line driver (LD) 406 may be included to the output load coupled at the output of the adaptive equalizer 400. It may be noted that in some examples, the PGA 404 and/or the LD 406 may be excluded. A buffer 408 is included to receive inputs from the CTLE 402, the PGA 404 and the LD 406. The output of the buffer 406 drives a power converter 410 that is included in the adaptive equalizer 400. The input resistance of the buffer 408 is high enough such that the buffer 408 does not affect the output resistance of the adaptive equalizer 400. Without the buffer 408, the bandwidth of the adaptive equalizer 400 would be affected by any capacitive loading at the output. Such capacitive loading would affect the locations of poles in the frequency response of the adaptive equalizer 400.

The power comparator 410 is a circuit to compare the power levels of low frequency and high frequency components in an input signal at the input of the adaptive equalizer 400. The low frequency and high frequency classification can be arbitrary in come embodiment and the low pass and high pass filters (discussed later) can be adjusted according to the arbitrary low frequency and high frequency ranges. At Gb/s data rates, the skin effect and dielectric loss of the channel cause frequency-dependent loss, thus resulting in inter-symbol interference (ISI). Various techniques have been developed to compensate for the signal loss along the transmission, including receiver equalization and transmitter de-emphasis. To further extend the transmission's reach at speeds as high as multi-Gb/s, a redriver is normally used to equalize and reshape the distorted signals so that the following host or device can recover the data without failing BER (bit error rate) specification. CTLEs are employed at the RX front end to compensate the channel loss and provide an equalized low-jitter output data. Implementing an equalizer with fixed peaking gain setting will result in non-optimum ISI at receiver input. Therefore, an adaptive equalizer to automatically detect and compensate the channel loss is preferred for some applications. Typical adaptive equalizers are controlled in continuous form and are controlled continuously during the communication. Embodiments of the adaptive equalizer described here, adjust the equalizer during the training period to avoid the extra tuning current consumption and avoids any injected noise that may cause BER failure during communication. If no training period is available, the adaptive equalizer 400 can do the equalization periodically at the beginning or during the communication. The adaptive equalizer 400 described here uses a control loop to optimize both equalization and gain, thus provides a better efficiency and space saving on a chip. The schematic of the adaptive equalizer 400 provides adaptive equalization and also automatic gain control depending on CTL1 or CTRL2 is being used.

The adaptive equalizer 400 includes a controller 412 to generate one or more control signals CTRL1, CTRL2 that are used to control the equalizer (to make an adaptive equalizer) and/or gain characteristics of the CTLE 402 and the PGA 404 (if included to make an automatic gain controller). For example, the control signal CTRL1 may be used as the control signal CTRL to control the characteristics of the CTLE 402, increasing or decreasing its gain. In one embodiment, the controller 412 may include an up-down counter that increments when the output of the power comparator 410 is high and decrements when the output of the power comparator 410 goes low. In some examples, successive approximation register (SAR) type up-down counter may be used. In some examples, the up-down counter in the controller 412 may be coupled to the life cycle control circuit of a chip in which the adaptive equalizer 402 is included to control the operations and activation of the equalizer process based on the programmed life cycle of the chip. For example, triggering the process at the startup of the chip or periodically can be controlled via the chip life cycle management. A line L1 couples the output of the CTLE 402 with the input of the buffer 408. A line L2 couples the output of the PGA 404 with the input of the buffer 408. A line L3 couples the output of the LD 406 with the input of the buffer 408. If the PGA 404 is not included in the circuit, lines L2 will also be excluded. Similarly, if the LD 406 is not included, the line L3 will be excluded. In another example, lines L1 and L2 may be excluded even when the PGA 404 and the LD 406 are present. At a time, only one of the lines will be connected to buffer 408. The shown line covers all the possible scenarios. Depending on the design strategy, any of the L1, L2 or L3 lines can be used, however in one preferred embodiment, the line L3 only can be used, which considers effect of output load (typically, 50-ohm) and non-ideality of PGA and LD (or any other circuitry in the redriver/repeater).

The adaptive equalizer 400 is configured to realize a transfer function which can be tuned such that it is inverse of the channel transfer function. The adaptive equalizer 400 improves the receiver performance parameters, such as BER and jitter tolerance. It should be noted that the adaptive equalizer 400 is also configured to provide automatic gain control.

Figure 5:
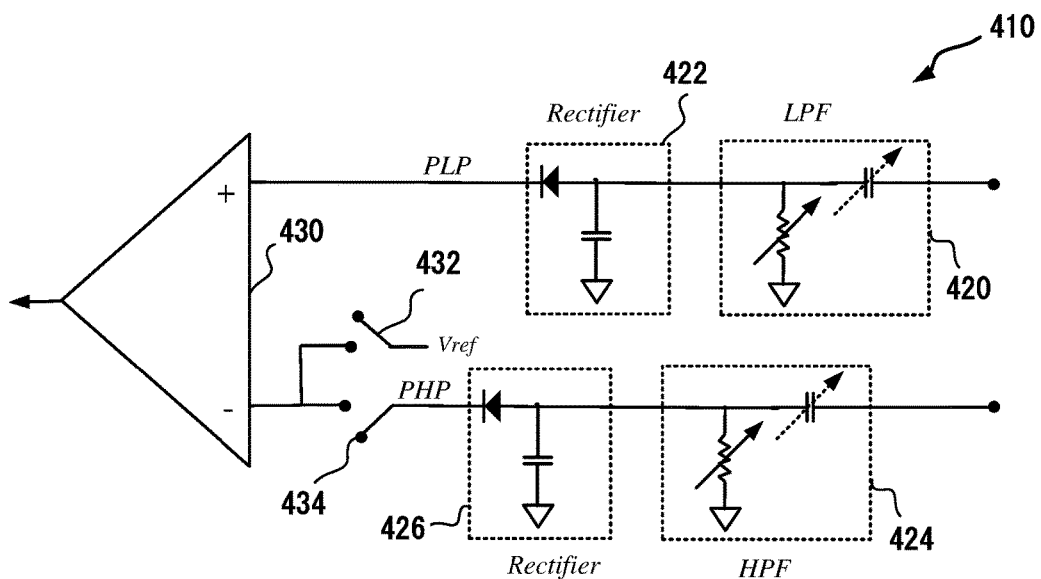
FIG. 5 depicts a circuit diagram a power comparator in accordance with one or more embodiments.
Figure 6:
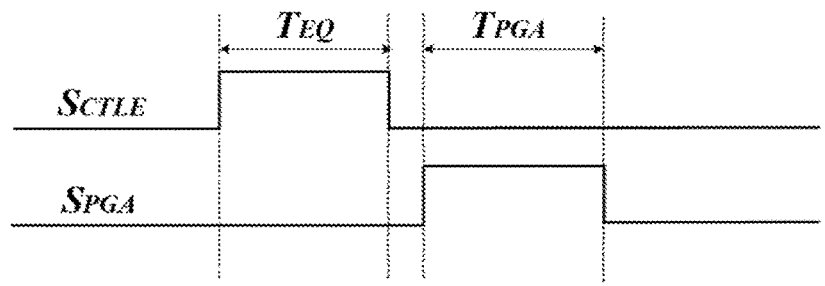
FIG. 6 depicts a switching diagram in accordance with one or more embodiments.

FIG. 5 shows a schematic of the power comparator 410. The power comparator 410 includes a low pass filter (LPF) 420 coupled with a first rectifier 422. The output of the first rectifier 422 is inputted to a comparator 430. The power comparator 410 also includes a high pass filter (HPF) 424 coupled with a second rectifier 426. The LPF 420 along with the first rectifier 422 provides the power $P_{LP}$ of the low frequency part of the input signal and the HPF 424 along with the second rectifier 426 provide the power $P_{HP}$ of the high frequency part of the input signal. The comparator 430 may include a fixed or variable reference voltage (Vref) input. Based on the comparator 430 output, the controller 412 may increment or decrement the counter and based on the counter value, control signals CTRL1 and CTRL2 are generated by the controller 412. The control signal CTRL1 is used to adjust the response of the CTLE 402 and the control signal CTRL2 is used to adjust the gain of the PGA 404. The comparator 430 may be a low speed comparator (e.g., MHz range). In some examples, the LPF 420 and HPF 424 may be programmable for desired frequency ranges using the variable resistors/capacitors. The voltage reference (Vref) can be adjustable or programmable. In one example, the output of the comparator 430 is "1" when $P_{LP}>P_{HP}$ for Vref=0v. A non-zero Vref acts as offset for the high frequency or low frequency parts, meaning makes up and can compensate for the high frequency part or low frequency part power difference. FIG. 6 shows a power comparator 410 in another embodiment that compares the power of the low frequency part of the input signal with a reference voltage Vref. The power comparator 410 may include a PGA switch 432 and a CTLE switch 434. The PGA switch 432 and the CTLE switch 434 are driven by the pulses shown in FIG. 6. The signal $S_{PGA}$ drives the PGA switch 432 and the signal $S_{CTLE}$ drives the CTLE switch 434. As shown, at a given time, only one of the PGA switch 432 or the CTLE switch 434 is ON.

When the PGA switch 432 is ON and the CTLE switch 434 is OFF, the control signal CTRL2 is generated and is used for adjusting the gain of the PGA 404. As shown, when the PGA switch 432 is ON and the CTLE switch 434 is OFF, the rectifier 426 and the HPF 424 are disconnected from the control loop that includes the buffer 408, the power comparator 410 and the controller 412. The low-pass path (including the LPF 420) determines power of the signal which is proportional to amplitude of the output. Vref which is adjustable to select different output swing. The comparator 430 compares the power of the equalized output signal with Vref. In some examples, a predefined lookup table may be stored in the controller 412 to produce the signal CTRL2 based on the output of the comparator 430 and the counter value that is incremented or decremented based on the output of the comparator 430. As shown in FIG. 6, in the next period (time frame), the control pulse turns the PGA switch 432 OFF and the CTLE switch 434 ON to generate the signal CTRL1. The output of the comparator 430 is generated based on whether high pass path has more power or less power compared to the low pass path. For example, first, the signal CTLR1 can be generated to set an equalized signal at the output of the CTLE 402 and then the signal CTLR2 can be generated to set a desired gain settings in the PGA 404.

In $T_{EQ}$ time frame, the signal CTLR1 is produced and applied to the CTLE 402. In $T_{PGA}$ time frame, the signal CTRL2 is generated and applied to the PGA 404. Both $T_{EQ}$ and $T_{PGA}$ time periods may be adjusted according to the selected protocol (e.g., USB). In some examples, after generated the signal CTRL2, the control loop may be turned off for a selected period of time to conserve power.

Figure 7A:
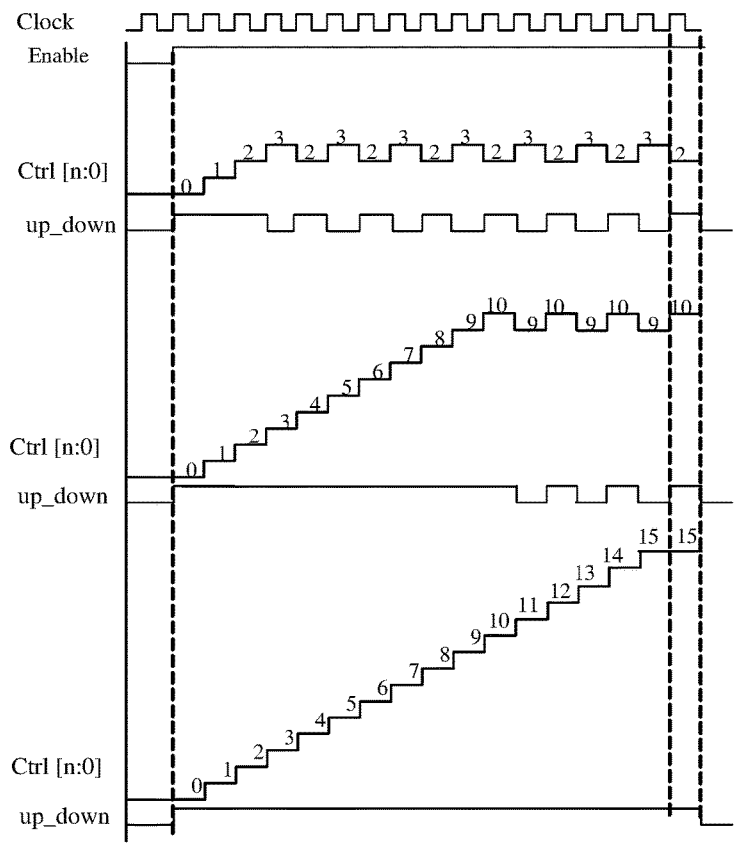
FIGS. 7A, 7B shows a counter output in accordance with one or more embodiments.
Figure 7B:
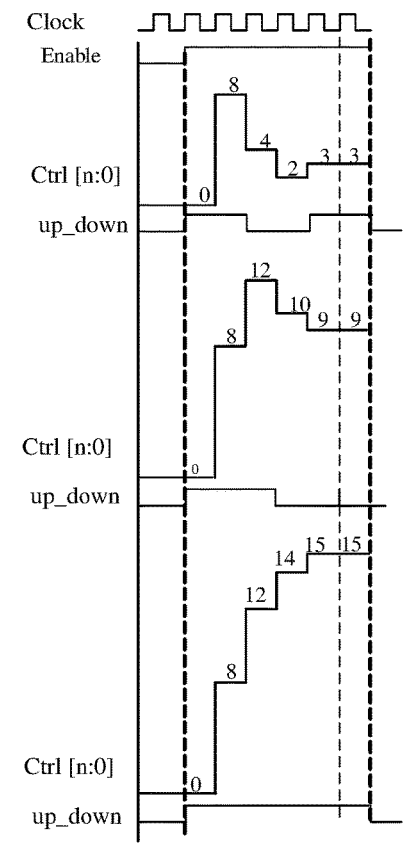

The controller 412 can be a simple up down counter which counts up & down linearly or a simple SAR logic (or based on optimization algorithm to find a predefined code for a counter value). The controller 412 may include an enable signal port to enable or disable the controller logic. As shown in FIG. 7A, the counter based logic will reach the maximum value of "$2^n-1$" during "$2^n$ clock" cycle and as shown in FIG. 7B, the SAR based logic will reach the maximum value of "$2^n-1$" during "n clock" cycle. One or two clocks can be added (say m, e.g., m=0 or 1 or 2) as a safety margin, so linear based counter is expected to converge at a maximum time of "$(2n+m)*Tclk$" while the SAR based logic is expected to converge at a maximum time of "$(n+m)*Tclk$". Tclk needs to be selected such that the output (e.g., up_down in FIGS. 7A, 7B) of the power comparator 410 be ready to make the right up/down decision for the loop that includes the power comparator 410 and the controller 412. Example of FIGS. 7A, 7B assumes n=3 and m=1.

In some examples, the buffer 408 may include a selector switch to select the line L1 or the line L2 or the line L3. The buffer 408 can be a multiplexer+buffer or switches+buffer to enable selection of one of the lines from the lines L1, L2 and L3.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An adaptive equalizer and automatic gain controller, comprising:
   a programmable continuous time linear equalizer (CTLE), wherein the CTLE includes a control port to receive a control signal to adjust a frequency response of the CTLE;
   a power comparator coupled with an output of the CTLE; and
   a controller including an up-down counter and coupled with the power comparator and the control port and configured to generate the control signal for the CTLE based on the output of the power comparator, wherein the power comparator is configured to compare power of a low frequency part and a high frequency part of an output signal of the CTLE.

2. The adaptive equalizer and automatic gain controller of claim 1, wherein the power comparator includes a low pass filter coupled with a rectifier and an output of the rectifier is coupled with a comparator.

3. The adaptive equalizer and automatic gain controller of claim 2, wherein the comparator is configured to compare a voltage at the output of the rectifier with a reference voltage.

4. The adaptive equalizer and automatic gain controller of claim 2, wherein the power comparator further includes a high pass filter coupled with a second rectifier and an output of the second rectifier is coupled with the comparator.

5. The adaptive equalizer and automatic gain controller of claim 4, wherein the comparator is configured to compare a voltage at the output of the rectifier with a voltage at the output of the second rectifier.

6. The adaptive equalizer and automatic gain controller of claim 5, wherein the up-down counter increments or decrements based on the output of the power comparator.

7. The adaptive equalizer and automatic gain controller of claim 6, wherein the controller is configured to generate the control signal based on counter value of the up-down counter.

8. The adaptive equalizer and automatic gain controller of claim 1, further including a programmable gain amplifier (PGA) coupled with the output of the CTLE.

9. The adaptive equalizer and automatic gain controller of claim 8, wherein an output of the PGA is coupled with an input of the power comparator through a buffer.

10. The adaptive equalizer and automatic gain controller of claim 8, further including a line driver coupled with the output of the PGA.

11. The adaptive equalizer and automatic gain controller of claim 10, wherein an output of the line driver is coupled with an input of the power comparator through a buffer.

12. The adaptive equalizer and automatic gain controller of claim 9, wherein the controller is configured to generate a second control signal based on an output of the power comparator to control a gain of the PGA.

13. The adaptive equalizer and automatic gain controller of claim 12, wherein the power comparator includes a first switch and a second switch, wherein the first switch and the second switch are configured such that only one of them is ON at a time.

14. The adaptive equalizer and automatic gain controller of claim 13, wherein when the first switch is ON and the second switch is OFF, the power comparator is configured to compare the power of the low frequency part with a reference voltage to generate the second control signal.

15. The adaptive equalizer of claim 1, wherein the controller includes an enable port to receive an enable signal, wherein the enable signal is automatically generated based on a mode of operation.

16. The adaptive equalizer of claim 4, wherein the low pass filter and the high pass filter include configurable components to configure a frequency cut-off of the low pass filter and the high pass filter.

17. A method for automatic equalization, comprising:

Comparing, in a first period, power of a low frequency part of a signal at an output of a programmable continuous time linear equalizer (CTLE) with power of a high frequency part of the signal to generate a first control signal and comparing, in a second period, the power of the low frequency part with a reference voltage to generate a second control signal;

based on the comparing, generate a first digital signal in the first period and a second digital signal in the second period using an up-down counter; and using the first digital signal to change a frequency response of the CTLE and the second digital signal to change a gain of a programmable gain amplifier, wherein the first period is different from the second period.

18. The method of claim 17, wherein the comparing includes filtering the signal using a low pass filter and a high pass filter, rectifying outputs of the low pass filter and the high pass filter and comparing the rectified outputs to generate the first digital signal.

19. The method of claim 17, wherein the comparing includes filtering the signal using a low pass filter, rectifying output of the low pass filter and comparing the rectified output with the reference voltage to generate the second digital signal.

20. An adaptive equalizer and automatic gain controller, comprising:

a programmable continuous time linear equalizer (CTLE), wherein the CTLE includes a control port to receive a control signal to adjust a frequency response of the CTLE;

a power comparator coupled with an output of the CTLE, wherein the power comparator includes a comparator and a rectifier; and a controller coupled with the power comparator and the control port and configured to generate the control signal for the CTLE based on the output of the power comparator, wherein the power comparator is configured to compare power of a low frequency part and a high frequency part of an output signal of the CTLE, wherein the comparator is configured to compare a voltage at the output of the rectifier with a reference voltage.

* * * * *